United States Patent [19]

Farbarik et al.

[11] Patent Number: 5,699,007

[45] Date of Patent: Dec. 16, 1997

[54] HIGH-SPEED SOLID STATE BUFFER CIRCUIT AND METHOD FOR PRODUCING THE SAME

[75] Inventors: Ray Farbarik; William H. Nicholls, both of Seattle, Wash.

[73] Assignee: Cascade Design Automation Corporation, Bellevue, Wash.

[21] Appl. No.: 583,935

[22] Filed: Jan. 11, 1996

Related U.S. Application Data

[63] Continuation of Ser. No. 196,022, Feb. 14, 1994, abandoned.

[51] Int. Cl.$^6$ ............................................. H03K 17/687
[52] U.S. Cl. ................................................ 327/435; 326/120
[58] Field of Search ................................ 326/72, 83, 104, 326/120, 25; 327/108, 112, 209, 544, 546, 566, 430, 431, 434, 435, 436, 437

[56] References Cited

U.S. PATENT DOCUMENTS

| | | | |
|---|---|---|---|
| 4,101,788 | 7/1978 | Baker | 326/120 |
| 4,264,829 | 4/1981 | Misaizu | 326/120 |
| 4,395,645 | 7/1983 | Pernyeszi | 326/83 |
| 4,477,735 | 10/1984 | Gollinger et al. | 326/120 |
| 4,583,011 | 4/1986 | Pechar | 326/120 |
| 4,716,311 | 12/1987 | Davenport et al. | 326/120 |
| 4,800,303 | 1/1989 | Graham et al. | 326/72 |
| 4,810,969 | 3/1989 | Fulkerson | 307/448 |
| 4,935,647 | 6/1990 | Larkins | 307/450 |
| 5,087,836 | 2/1992 | Taylor | 326/120 |

FOREIGN PATENT DOCUMENTS

| | | | |
|---|---|---|---|
| 402209011 | 8/1990 | Japan | 327/435 |

*Primary Examiner*—Timothy P. Callahan
*Assistant Examiner*—My-Trang Nu Ton
*Attorney, Agent, or Firm*—Robert M. Storwick

[57] ABSTRACT

A high-speed solid state buffer circuit and method for producing the same. A buffer circuit accepts logic input signals and transforms the signals to an output signal which can drive a heavy load. By using an output stage pull-up device that includes a parallel combination of an enhancement mode FET and a depletion mode FET, a solid-state buffer circuit with increased speed and output voltage swing is achieved. Most conveniently, the buffer takes the form of a logic inverter. However, the buffer can also be used to form a multiple input NOR gate. The circuit is most suitable for realization in GaAs technology.

24 Claims, 4 Drawing Sheets

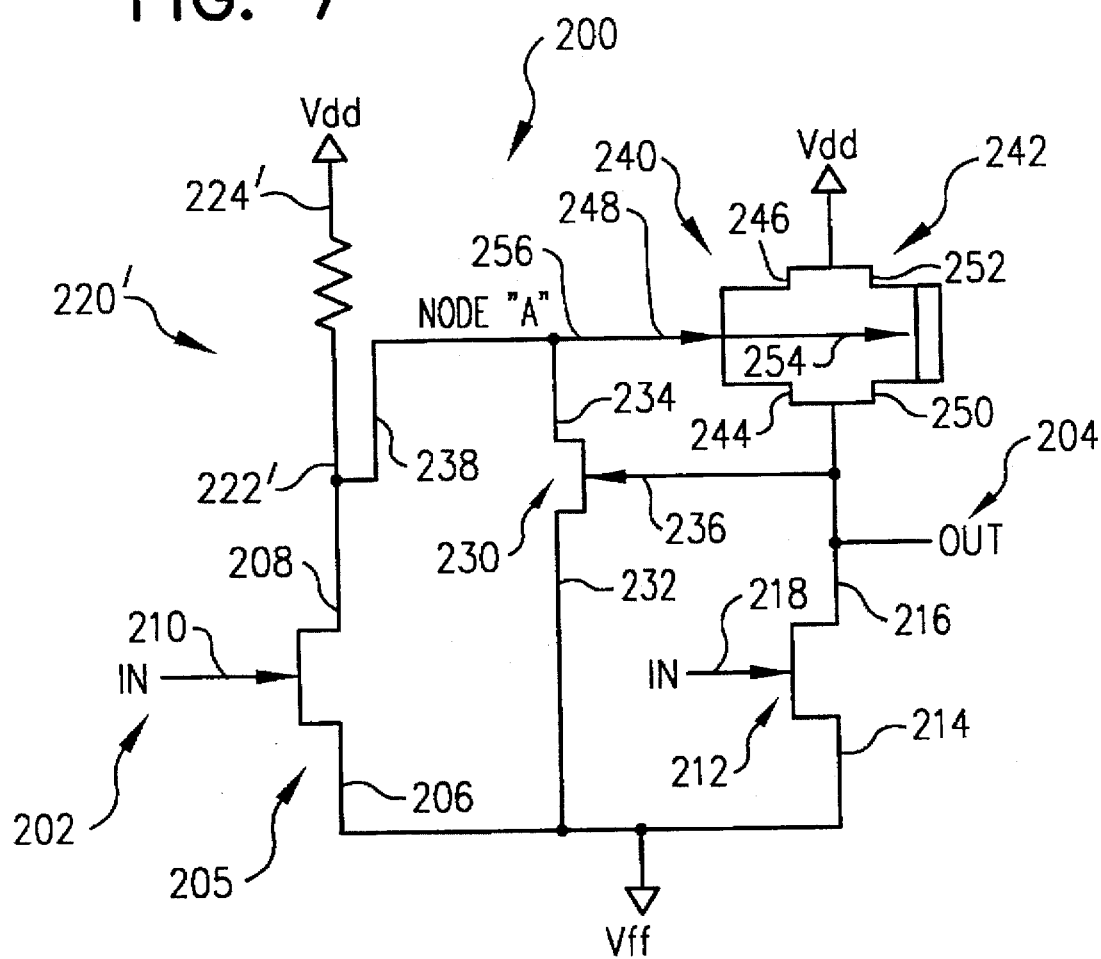

HIGH-SPEED SOLID STATE BUFFER CIRCUIT AND METHOD FOR PRODUCING THE SAME

This application is a continuation of application Ser. No. 08/196,022 now abandoned, filed Feb. 14, 1994, the benefit of the filing dates of which are hereby claimed under 35 USC 120.

FIELD OF THE INVENTION

This invention relates generally to solid state circuits, and more particularly, to a method and apparatus for producing a high-speed solid state buffer circuit.

BACKGROUND OF THE INVENTION

Field-effect transistors (FETs) are typically used in integrated circuits because their planar structures can more easily be designed for compact placement on semiconductor substrates. FETs are particularly useful in digital circuitry, which uses large dense arrays of FETs to implement desired digital memory and logic functions. Three important factors in the acceptance of a typical implementation of digital circuitry are 1) the circuitry's speed, 2) its power consumption, and 3) its voltage swing. These are factors which generally oppose each other. Accordingly, digital circuit designers are continually looking for improved component designs that give acceptably high speed and voltage swing without exceeding power consumption constraints.

One important class of digital circuitry are buffers, which are used to transfer an output digital signal to many input devices. One important subclass of buffers is an inverter, whose output is the logical inverse of its input. Another important subclass of buffers is a NOR gate, which computes the logical NOR function of two or more input signals. Generally, the more devices that need to be driven by either the buffer or the gate, the slower the circuit's response.

Semiconductor materials research has long been focused on gallium arsenide (GaAs, group III-IV semiconductor material) circuitry, due to its high intrinsic speed and low power consumption. While GaAs is capable of producing fast low-consumption devices, its fullest potential can be realized when it is used to produce highly efficient digital circuitry.

It has been known in the past to have GaAs circuitry that performs desirably in two out the three desirable areas. For example, Larkin, in U.S. Pat. No. 4,935,647, discloses a buffer circuit that has low power consumption and good voltage swing, and is also small. However, this buffer can be undesirably slow. Fulkerson, in U.S. Pat. No. 4,810,969, discloses a buffer that is fast, consumes low power and is small, and yet has poor output voltage swing.

Accordingly, it is desirable to produce solid state circuitry, including digital buffers and NOR gates which are fast, yet have low power consumption and acceptably large output voltage swing. It is particularly desirable to produce GaAS circuitry that has these features.

SUMMARY OF THE INVENTION

According to one aspect, the invention is a solid state buffer circuit for generating an output signal in response to a first input signal. The solid state buffer circuit has a first input terminal to receive the first input signal, an output terminal to produce the output signal, and first and second input power terminals. The solid state buffer circuit comprises first and second input transistors, a third electronic component, and fourth, fifth and sixth transistors.

The first input transistor has first power terminals and a first gate terminal. The first gate terminal is connected to the first input terminal of the solid state buffer circuit, and one of the first power terminals is connected to the second input power terminal of the solid state buffer circuit.

The second input transistor has second power terminals and a second gate terminal. The second gate terminal is connected to the first input terminal of the solid state buffer circuit. One of the second power terminals is connected to the second input power terminal of the solid state buffer circuit, and the other of the second power terminals is connected to the output terminal of the solid state buffer circuit.

The third electronic component has third power terminals. One of the third power terminals is connected to the other of the first power terminals and the other of the third power terminals is connected to the first input power terminal of the solid state buffer circuit.

The fourth transistor has fourth power terminals and a fourth gate terminal. One of the fourth power terminals is connected to the second input power terminal of the solid state buffer circuit. The other of the fourth power terminals is connected to the other of the first power terminals of the first transistor, and the gate terminal of the fourth transistor is connected to the output terminal of the solid state buffer circuit.

One of the fifth and sixth transistors is an enhancement mode field-effect transistor and the other of the fifth and sixth transistors is a depletion mode field-effect transistor. The fifth and sixth transistors have respective fifth and sixth pairs of power terminals and respective fifth and sixth gate terminals. One of each of the power terminals in the fifth and sixth pairs of power terminals is connected to the first input power terminal of the solid state buffer circuit. The other of each of the power terminals in the fifth and sixth pair of power terminals is connected to the output terminal of the solid state buffer circuit, and each of the gates of the fifth and sixth transistors is connected to the other first power terminal of the first transistor.

According to a second aspect, the invention is a solid state NOR circuit for generating an output logic signal in response to first and second input logic signals. The output logic signal has substantially only one of two possible output logic values (HIout or LOout) at a time, and the first and second input logic signals each have substantially only one of two possible input logic values (HIin or LOin) at a time. The solid state NOR circuit has a first input terminal to receive the first input logic signal, a second input terminal to receive the second input logic signal, an output terminal to produce the output logic signal, and first and second input power terminals.

The solid state NOR circuit comprises first and second input transistors, a third electronic component, and fourth, fifth, sixth, seventh and eighth transistors. The first input transistor has first power terminals and a first gate terminal. The first gate terminal is connected to the first input terminal of the solid state NOR circuit and one of the first power terminals is connected to the second input power terminal of the solid state NOR circuit.

The second input transistor has second power terminals and a second gate terminal. The second gate terminal is connected to the first input terminal of the solid state NOR circuit. One of the second power terminals is connected to the second input power terminal of the solid state NOR circuit, and the other of the second power terminals is connected to the output terminal of the solid state NOR circuit.

The third electronic component has third power terminals. One of the third power terminals is connected to the other of the first power terminals and the other of the third power terminals is connected to the first input power terminal of the solid state NOR circuit.

The fourth transistor has fourth power terminals and a fourth gate terminal. One of the fourth power terminals is connected to the second input power terminal of the solid state NOR circuit. The other of the fourth power terminals is connected to the other of the first power terminals of the first transistor. The gate terminal of the fourth transistor is connected to the output terminal of the solid state NOR circuit. One of the fifth and sixth transistors is an enhancement mode field-effect transistor and the other of the fifth and sixth transistors is a depletion mode field-effect transistor. The fifth and sixth transistors have respective fifth and sixth pairs of power terminals and respective fifth and sixth gate terminals. One of each of the power terminals in the fifth and sixth pairs of power terminals is connected to the first input power terminal of the solid state NOR circuit. The other of each of the power terminals in the fifth and sixth pair of power terminals is connected to the output terminal of the solid state NOR circuit, and each of the gates of the fifth and sixth transistors is connected to the other first power terminal of the first transistor.

The seventh input transistor has seventh power terminals and a seventh gate terminal. The seventh gate terminal is connected to the second input terminal of the solid state NOR circuit. One of the seventh power terminals is connected to one of the first and second input power terminals of the solid state NOR circuit, and the other of the seventh power terminals is connected to the third gate terminal of the third transistor.

The eighth input transistor has eighth power terminals and an eighth gate terminal. The eighth gate terminal is connected to the second input terminal of the solid state NOR circuit. One of the eighth power terminals is connected to the same one of the first and second input power terminals of the solid state NOR circuit to which the one of the seventh power terminals of the seventh input transistor is connected. The other of the second power terminals is connected to the output terminal of the solid state NOR circuit.

By this arrangement, the output logic signal is the logical NOR of the first input logic signal and the second input logic signal.

According to a third aspect, the invention is a method for producing a solid state buffer circuit that generates an output signal in response to an input signal. The solid state buffer circuit has an input terminal to receive the first input signal, an output terminal to produce the output signal, and first and second input power terminals.

The method comprises the steps of: a) producing a first input transistor having first power terminals and a first gate terminal, the first gate terminal being connected to the input terminal of the solid state buffer circuit and one of the first power terminals being connected to the second input power terminal of the solid state buffer circuit and b) producing a second input transistor having second power terminals and a second gate terminal. The method also comprises the steps of: c) connecting the second gate terminal to the input terminal of the solid state buffer circuit, d) connecting one of the second power terminals to the second input power terminal of the solid state buffer circuit, and e) connecting the output terminal of the solid state buffer circuit. In addition, the method comprises the steps of: f) producing a third transistor having third power terminals and a third gate terminal, g) connecting the third gate terminal to one of the third power terminals and to the other of the first power terminals, and h) connecting the other of the third power terminals to the first input power terminal of the solid state buffer circuit.

Still further, the method comprises the steps of: i) producing a fourth transistor having fourth power terminals and a fourth gate terminal, j) connecting one of the fourth power terminals to the second input power terminal of the solid state buffer circuit, k) connecting the other of the fourth power terminals to the other of the first power terminals of the first transistor and to the third gate terminal, and l) connecting the gate of the fourth transistor to the output terminal of the solid state buffer circuit.

Further, the method comprises the steps of: m) producing fifth and sixth transistors, one of the fifth and sixth transistors being an enhancement mode field-effect transistor and the other of the fifth and sixth transistors being a depletion mode field-effect transistor, the fifth and sixth transistors having respective fifth and sixth pairs of power terminals and respective fifth and sixth gate terminals, n) connecting one of each of the power terminals in the fifth and sixth pairs of power terminals to the first input power terminal of the solid state buffer circuit, o) connecting the other of each of the power terminals in the fifth and sixth pair of power terminals to the output terminal of the solid state buffer circuit, and p) connecting each of the gates of the fifth and sixth transistors to the gate of the third transistor.

BRIEF DESCRIPTION OF THE DRAWINGS

FIG. 7 is a schematic diagram of a second inverter embodiment of the present invention.

DETAILED DESCRIPTION OF THE PREFERRED EMBODIMENT

Figure 1:
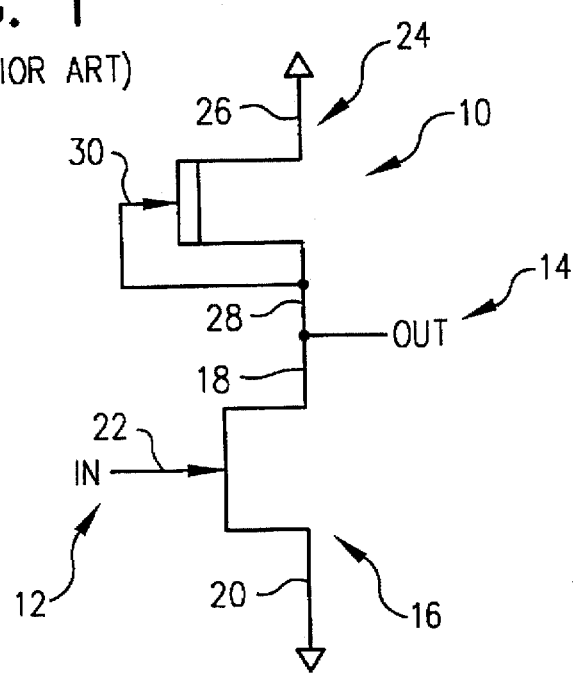
FIG. 1 is a schematic diagram of a first inverter circuit known in the prior art.

FIG. 1 is schematic diagram of a first inverter circuit known in the prior art. The first inverter 10 includes two FETs. The inverter 10 accepts an input digital signal on the input pin 12 and produces an output voltage on the output pin 14. The first FET 16, which is an enhancement mode FET, has two power terminals 18 and 20 and a gate terminal 22. The second FET 24, which is a depletion mode transistor operating as a pull-up device, has two power terminals 26 and 28 and a gate terminal 30. The power terminal 20 of the first FET 16 is connected to a source voltage VS. The power terminal 26 of the second FET 24 is connected to a drain voltage VD. The gate 30 of the second FET 24 is connected to its other power terminal 28, and the two power terminals 18 and 28 are connected together, and to the output pin 14. The input signal that is applied to the input pin 12 transitions from a logical low input value LOin to a logical high input value HIin, and vice versa. In response, the output signal that is produced at the output pin 14 transitions from a logical high output value HIout to a logical low output value LOout, and vice versa. An important deficiency of this circuit is that its response to quick input transitions is quite slow. Further, aside from a delay between the imposition of a logical voltage transition on the input 12 and the resulting transition on the output 14, the transitions are not symmetric. That is, the delay in response to a falling input signal is greater than the delay in response to a rising input signal.

Figure 2:
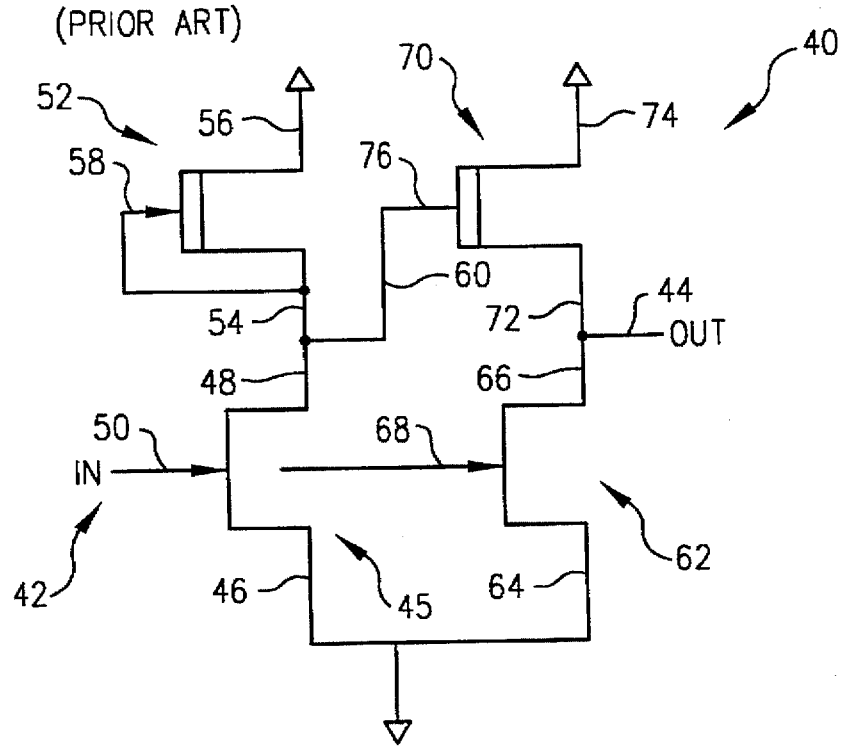
FIG. 2 is a schematic diagram of a second inverter circuit known in the prior art.

FIG. 2 is schematic diagram of a second inverter circuit known in the prior art. The inverter 40 includes four FETs. The input signal to the inverter 40 is imposed on the input pin 42, and the output is produced on the output pin 44. The first FET 45, which is an enhancement mode FET, has two power terminals 46 and 48 and a gate terminal 50. The second FET 52, which is a depletion mode FET, has two power terminals 54 and 56 and a gate terminal 58. The power terminal 46 of the first FET is connected to the source voltage VS. The power terminal 56 of the FET 52 is connected to the drain voltage VD. The gate 58 of the FET 52 is connected to the power terminal 54 which is also connected to the power terminal 48 and the line 60.

The third FET 62, which is an enhancement mode FET, has two power terminals 64 and 66 and a gate 68. The fourth FET 70, which is a depletion mode FET, also has two power terminals 72 and 74 and a gate terminal 76. The power terminal 64 is also connected to the source voltage and the power terminal 66 of the FET 62 is connected to both the power terminal 72 of the fourth FET 70 and the output pin 44. The gate 68 of the third FET 62 is also connected to the input pin 42. The power terminal 74 of the fourth FET 70 is connected to the drain voltage source VD and the gate terminal 76 of the fourth FET 70 is connected to the line 60.

Comparison of the prior art inverter shown in FIG. 1 with the prior art inverter shown in FIG. 2 shows that the prior art inverter shown in FIG. 2 contains the prior art inverter shown in FIG. 1 with the addition of the configuration consisting of the third and fourth FETs 62 and 70. The turn-on, turn-off characteristics of the prior art inverter shown in FIG. 2 are superior to those shown in FIG. 1 because, on turn-on, the downward transition of the signal on line 60 quickly reduces the voltage on the gate 76 of the fourth FET 70, thereby turning on the third FET 62 very quickly. On the other hand, as the voltage on the input changes from high to low, the gate of the fourth FET 70 rises very quickly allowing the increased current through the fourth FET 70 to quickly charge the circuit load when the third FET 62 turns off.

Figure 3:
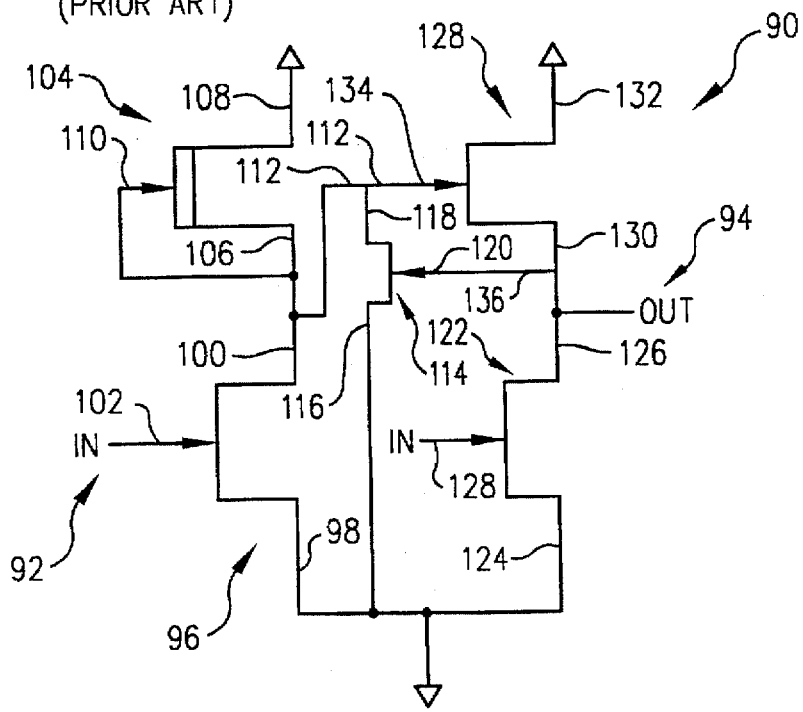
FIG. 3 is a schematic diagram of a third inverter circuit known in the prior art.

FIG. 3 is schematic diagram of a third inverter circuit known in the prior art. The inverter 90 has an input 92 and an output 94. The first FET 96, which is an enhancement mode FET, has two power terminals 98 and 100 and a gate terminal 102. The second FET 104, which is a depletion mode FET, has two power terminals 106 and 108 and a gate terminal 110. The power terminal 98 of the first FET 96 is connected to a source voltage and the gate terminal 102 of the first FET 96 is connected to the input 92. The power terminal 108 of the second FET 104 is connected to a drain voltage and the power terminal 100 of the first FET 96 and the power terminal 106 and gate terminal 110 of the second FET 104 are connected together and to the line 112.

A third FET 114, which is an enhancement mode FET, has two power terminals 116 and 118 and a gate terminal 120. The power terminal 116 is also connected to the source voltage and the power terminal 118 of the third FET 114 is connected to the line 112.

The fourth FET 122, which is also an enhancement mode FET, has two power terminals 124 and 126 and a gate terminal 128. The fifth FET 128, which is likewise an enhancement mode FET, has two power terminals 130 and 132 and a gate terminal 134. The power terminal 124 of the fourth FET 122 is also connected to the source voltage, and the gate terminal 128 is connected to the input 92 (connection not shown). The power terminal 132 of the fifth FET 128 is connected to the drain voltage. The power terminal 130 of the fifth FET 128 is connected to the gate terminal 120 of the third FET 114 through the line 136, to the power terminal 126 of the fourth FET 122 and to the output 94.

In operation, the inverter of FIG. 3 is very similar to that of FIG. 2, except that the output 94 controls the FET 114 to turn off FET 128, thus saving power. Unfortunately, the output voltage swing of the inverter circuit in FIG. 3 is relatively small (15-550 mV).

Figure 4:
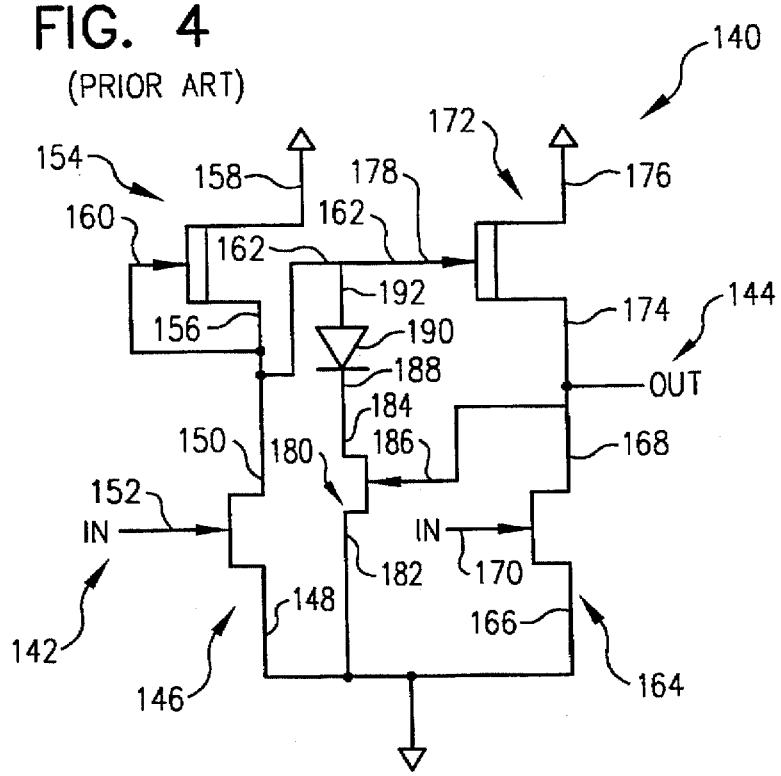
FIG. 4 is a schematic diagram of a fourth inverter circuit known in the prior art.

FIG. 4 is schematic diagram of a fourth inverter circuit known in the prior art. The inverter 140 has an input 142 and an output 144. The inverter contains five FETs. The first FET 146, which is an enhancement mode FET, has two power terminals 148 and 150 and a gate terminal 152. The second FET 154, which is a depletion mode FET, has two power terminals 156 and 158 and a gate terminal 160. The power terminal 148 of the first FET 146 is connected to a source voltage. The gate terminal 152 of the first FET 146 is connected to the input 142. The power terminal 158 of the second FET 154 is connected to a drain voltage. The gate terminal 160 of the second FET 154 is connected to the power terminal 156 of the second FET 154, to the power terminal 150 of the first FET 146, and to a line 162.

The third FET 164, which is an enhancement mode transistor, has two power terminals 166 and 168 and a gate terminal 170. The fourth FET 172, which is also a depletion mode FET, has two power terminals 174 and 176 and a gate terminal 178. The power terminal 166 of the fourth FET 164 is connected to the source voltage. The gate terminal 170 of the third FET 164 is connected to the input 142 (connection not shown). The power terminal 176 of the fourth FET 172 is connected to the drain voltage, and the gate terminal 178 of the fourth FET 172 is connected to the line 162.

The fifth FET 180, which is an enhancement FET, has two power terminals 182 and 184 and a gate terminal 186. The power terminal 182 is connected to the source voltage VS. The gate terminal 186 is connected to the output 144, along with the power terminal 168 of the third FET 164 and the power terminal 174 of the fourth FET 172. The power terminal 184 of the fifth FET 180 is connected to the cathode 188 of a diode 190, which also has an anode 192. The anode 192 of the diode 190 is connected to the line 162.

Figure 5:
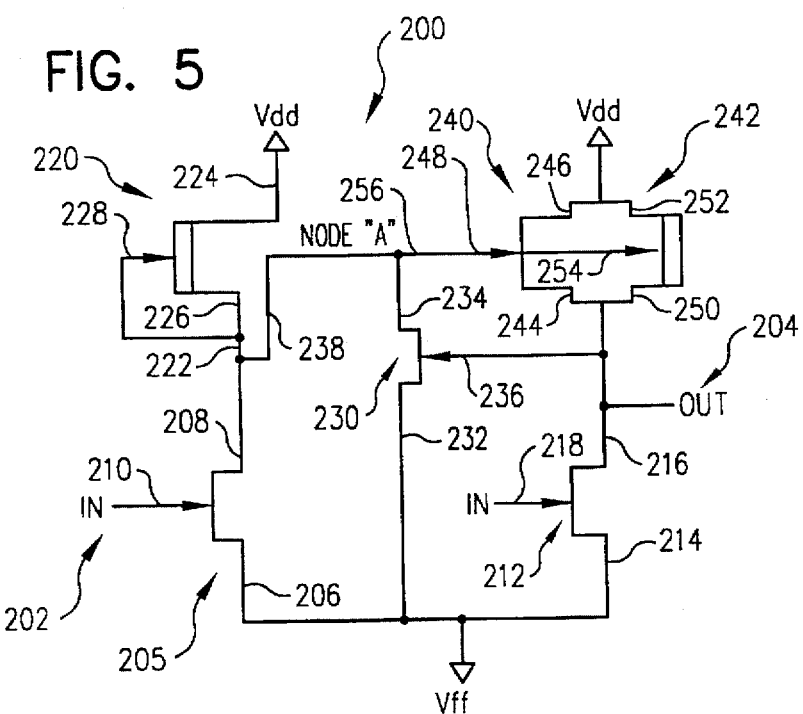
FIG. 5 is a schematic diagram of an inverter embodiment of the present invention.

FIG. 5 is schematic diagram of an inverter embodiment of the present invention. The buffer 200 has an input 202 and an output 204. The buffer 200 includes a first FET 205, which is an enhancement mode FET, having power terminals 206 and 208 and a gate terminal 210. The power terminal 206 is connected to a source voltage and the gate terminal 210 is connected to the input 202. A second FET 212, which is an enhancement mode FET, has power terminals 214 and 216 and a gate terminal 218. The power terminal 214 is also connected to the source voltage. The gate terminal 218 is also connected to the input 202 (connection not shown). A third FET 220, which is a depletion mode FET, is an electronic component having a first terminal 222 and a second terminal 224. The first terminal 222 is produced by connecting terminal 226, one of the power terminals of the third FET 220, to a gate terminal 228 of the third FET 220. The second terminal 224 is another power terminal of the third FET 220. If desired, the third component could also be an appropriately chosen resistor. A fourth FET 230, which is an enhancement mode FET, has two power terminals 232 and 234 and a gate terminal 236. The power terminal 232 is connected to the supply voltage. The other power terminal 234 is connected to the first terminal 222 of the third electronic component 220 through a line 238.

FIG. 7 is a schematic diagram of a second inverter embodiment of the present invention. In FIG. 7 the third FET 220, which is the third electronic component shown in FIG. 5, is replaced by a resistor 220' having first and second terminals 222' and 224'. The first and second terminals 222' and 224' correspond to respective first and second terminals 222 and 224.

The inventive buffer 200 in FIG. 5 also includes a parallel combination of fifth and sixth FETs 240 and 242, respectively. The fifth FET 240, which is an enhancement mode FET, includes two power terminals 244 and 246 and a gate terminal 248. The sixth FET 242, which is a depletion mode FET, includes two power terminals 250 and 252 and a gate terminal 254. The power terminal 246 of the fifth FET 240 and the power terminal 252 of the sixth FET 242 are both connected to the drain voltage. The gate terminal 248 of the fifth FET 240 and the gate terminal 254 of the sixth FET 242 are both connected to the power terminal 234 of the fourth FET 230 through the line 256. The power terminal 244 of the fifth FET 240 and the power terminal 250 of the sixth FET 242 are both connected to the output 204.

In operation the buffer 200 shown in FIG. 5 produces an output low when it receives an input high and vice versa. When the buffer 200 receives an input high, the first FET 205 is turned on, driving the power terminal 208 of the first FET 205 to logic low. The third electronic device 220 does not conduct much at this point. Since the power terminal 208 is low, so are the voltages on the gate terminals 248 and 254 of the fifth and sixth FETs 240 and 242, respectively, turning them off. Also, the second FET 212 is strongly on, driving the voltage at output 204 to a logic low. Also, the fourth FET 230 is off since the output 204 is low.

When the buffer 200 receives an input low, the first FET 205 is off, allowing the third electronic device 220 to turn on and, consequently, allowing the voltage on the power terminal 208 of the first FET 205 to go high. The fifth and sixth FETs 240 and 242 are turned on by the voltage on the power terminal 208 of the first FET 205, which passes to the gate terminals 246 and 254 of the fifth and sixth FETs 240 and 242, respectively, through the lines 238 and 256. This pulls the voltage on the output 204 high. When the voltage on output 204 reaches logic high, the fourth FET 230 turns on and pulls the voltage on the lines 238 and 256 low, making the fifth and sixth FET 240 and 242 both slightly on, thus saving power.

When driving an output high, the inverter of FIG. 5 is as fast as the inverter of FIG. 3, since the buffer 200 has a large enhanced mode pullup in the form of fifth FET 240. The sixth FET 242 enhances the output swing of the buffer 200 by allowing the output high level to be even higher. The large output swing allows the circuit to be more reliable.

Figure 6:
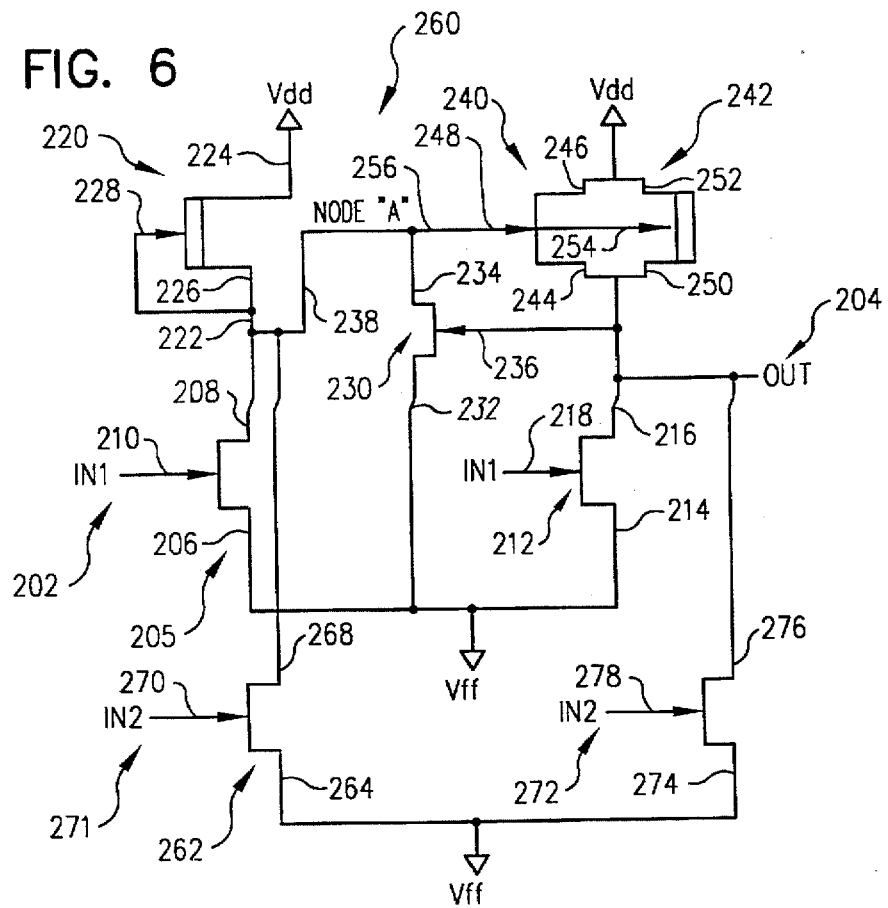
FIG. 6 is a schematic diagram of a NOR gate embodiment of the present invention.

FIG. 6 is a schematic diagram of a NOR gate embodiment of the present invention. In the NOR gate 260, the components with reference numerals from 202 to 256 serve exactly the same function as they do in the buffer 200 shown in FIG. 5. In addition to these components, the NOR gate 260 also includes a seventh FET 262, which is an enhancement mode FET, having two power terminals 264 and 268 and a gate terminal 270. The gate 270 is connected to a second input IN2 271 (to distinguish, the first input 202 is relabeled as IN1 in FIG. 6). One of the power terminals 264 is connected to the source voltage and the other power terminal 268 is connected to the line 238.

The eighth FET 272, which is also an enhancement mode FET, has two power terminals 274 and 276 and a gate terminal 278. The power terminal 274 is connected to the source voltage. The gate terminal 278 is also connected to the second input IN2 271 (connection not shown). The other power terminal 276 is connected to the output 204. It can be seen by observation that the seventh and eighth FETs 262 and 272 are directly parallel to the first and second FETs 205 and 212. Accordingly, the NOR gate 260 responds to inputs on IN2 271 exactly as it would to the same inputs on the input IN1 202. This operates as a NOR gate.

The preferred embodiments of the present invention have been described in detail sufficient for one skilled in the electronics arts to understand the invention. Such skilled persons, however, could devise alternative embodiments to that described herein while remaining within the scope of the appended claims. Accordingly, the scope of the invention is to be limited only by the appended claims.

We claim:

1. A solid state buffer circuit for generating an output signal in response to a first input signal, the solid state buffer circuit having a first input terminal to receive the first input signal, an output terminal to produce the output signal, and first and second input power terminals, the solid state buffer circuit comprising:

a first input transistor having first power terminals and a first gate terminal, the first gate terminal being connected to the first input terminal of the solid state buffer circuit and one of the first power terminals being connected to the second input power terminal of the solid state buffer circuit;

a second input transistor having second power terminals and a second gate terminal, the second gate terminal being connected to the first input terminal of the solid state buffer circuit, one of the second power terminals being connected to the second input power terminal of the solid state buffer circuit, and the other of the second power terminals being connected to the output terminal of the solid state buffer circuit;

a third electronic component having third power terminals, one of the third power terminals being connected to the other of the first power terminals and the other of the third power terminals being connected to the first input power terminal of the solid state buffer circuit;

a fourth transistor having fourth power terminals and a fourth gate terminal, one of the fourth power terminals being connected to the second input power terminal of the solid state buffer circuit, the other of the fourth power terminals being connected to the other of the first power terminals of the first transistor, the gate terminal of the fourth transistor being connected to the output terminal of the solid state buffer circuit; and fifth and sixth transistors, one of the fifth and sixth transistors being an enhancement mode field-effect transistor and the other of the fifth and sixth transistors being a depletion mode field-effect transistor, the fifth and sixth transistors having respective fifth and sixth pairs of power terminals and respective fifth and sixth gate terminals, one of each of the power terminals in the fifth and sixth pairs of power terminals being connected to the first input power terminal of the solid state buffer circuit, the other of each of the power terminals in the fifth and sixth pair of power terminals being connected to the output terminal of the solid state buffer circuit, and each of the gates of the fifth and sixth transistors being connected to the other power terminal of the first transistor.

2. The solid state buffer circuit of claim 1 wherein the third electronic component is a third transistor, the third transistor having the third power terminals and a third gate terminal, the third gate terminal being connected to one of the third power terminals and to the other of the first power terminals, the other of the third power terminals being connected to the first input power terminal of the solid state buffer circuit.

3. The solid state buffer circuit of claim 1 wherein the first, second, fourth, fifth and sixth transistors and the third electronic component are gallium-arsenide technology devices.

4. The solid state buffer circuit of claim 1 wherein the third electronic component is a resistor, the resistor having two third power terminals, the other of the third power terminals being connected to the first input power terminal of the solid state buffer circuit.

5. The solid state buffer circuit of claim 1 wherein the first, second, and fourth transistors are enhancement mode field-effect transistors and the third electronic component is a depletion mode field-effect transistor.

6. The solid state buffer circuit of claim 5 wherein the first, second, fourth, fifth and sixth transistors and the third electronic component are gallium-arsenide technology devices.

7. The solid state buffer circuit of claim 1, wherein the output signal is also generated in response to a second input signal, the solid state buffer circuit further comprising:

a second input terminal to receive the second input signal;

a seventh input transistor having seventh power terminals and a seventh gate terminal, the seventh gate terminal being connected to the second input terminal of the solid state buffer circuit, one of the seventh power terminals being connected to the second input power terminal of the solid state buffer circuit and the other of the seventh power terminals being connected to the other third power terminal of the third transistor;

an eighth input transistor having eighth power terminals and an eighth gate terminal, the eighth gate terminal being connected to the second input terminal of the solid state buffer circuit, one of the eighth power terminals being connected to the second input power terminal of the solid state buffet circuit, and the other of the second power terminals being connected to the output terminal of the solid state buffer circuit.

8. A solid state buffer circuit for generating an output logic signal having substantially only one of two possible output logic values (HIout or LOout) at a time, the output logic signal being a logical inverse of a first input logic signal, the first input logic signal having substantially only one of two possible input logic values (HIin or LOin) at a time, the solid state buffer circuit having a first input terminal to receive the first input logic signal, an output terminal to produce the output logic signal, and first and second input power terminals, the solid state inverter circuit comprising:

a first input transistor having first power terminals and a first gate terminal, the first gate terminal being connected to the first input terminal of the solid state inverter circuit and one of the first power terminals being connected to the second input power terminal of the solid state buffer circuit;

a second input transistor having second power terminals and a second gate terminal, the second gate terminal being connected to the first input terminal of the solid state inverter circuit, one of the second power terminals being connected to the second input power terminal of the solid state inverter circuit, and the other of the second power terminals being connected to the output terminal of the solid state inverter circuit;

a third electronic component having third power terminals, one of the third power terminals being connected to the other of the first power terminals of the first transistor and the other of the third power terminals being connected to the first input power terminal of the solid state buffer circuit;

a fourth transistor having fourth power terminals and a fourth gate terminal, one of the fourth power terminals being connected to the second input power terminal of the solid state buffer circuit, the other of the fourth power terminals being connected to the other of the first power terminals of the first transistor, the gate terminal of the fourth transistor being connected to the output terminal of the solid state buffer circuit; and fifth and sixth transistors, one of the fifth and sixth transistors being an enhancement mode field-effect transistor and the other of the fifth and sixth transistors being a depletion mode field-effect transistor, the fifth and sixth transistors having respective fifth and sixth pairs of power terminals and respective fifth and sixth gate terminals, one of each of the power terminals in the fifth and sixth pairs of power terminals being connected to the first input power terminal of the solid state buffer circuit, the other of each of the power terminals in the fifth and sixth pair of power terminals being connected to the output terminal of the solid state buffer circuit, and each of the gates of the fifth and sixth transistors being connected to the other third power terminal of the third transistor, whereby a transition of the first input logic signal from LOin to HIin causes a transition of the output logic signal from HIout to LOout, and a transition of the first input logic signal from HIin to LOin causes a transition of the output logic signal from LOout to HIout.

9. The solid state buffer circuit of claim 8 wherein the third electronic component is a third transistor, the third transistor having the third power terminals and a third gate terminal, the third gate terminal being connected to one of the third power terminals and to the other of the first power terminals, the other of the third power terminals being connected to the first input power terminal of the solid state buffer circuit.

10. The solid state buffer circuit of claim 8 wherein the first, second, fourth, fifth and sixth transistors and the third electronic component are gallium-arsenide technology devices.

11. The solid state buffer circuit of claim 8 wherein the first, second, and fourth transistors are enhancement mode field-effect transistors and the third electronic component is a depletion mode field-effect transistor.

12. A solid state NOR circuit for generating an output logic signal in response to first and second input logic signals, the output logic signal having substantially only one of two possible output logic values (HIout or LOout) at a time, the first and second input logic signals each having substantially only one of two possible input logic values (HIin or LOin) at a time, the solid state NOR circuit having a first input terminal to receive the first input logic signal, a second input terminal to receive the second input logic signal, an output terminal to produce the output logic signal, and first and second input power terminals, the solid state NOR circuit comprising:

a first input transistor having first power terminals and a first gate terminal, the first gate terminal being connected to the first input terminal of the solid state NOR circuit and one of the first power terminals being connected to the second input power terminal of the solid state NOR circuit;

a second input transistor having second power terminals and a second gate terminal, the second gate terminal being connected to the first input terminal of the solid state NOR circuit, one of the second power terminals being connected to the second input power terminal of the solid state NOR circuit, and the other of the second power terminals being connected to the output terminal of the solid state NOR circuit;

a third electronic component having third power terminals, one of the third power terminals being connected to the other of the first power terminals and the other of the third power terminals being connected to the first input power terminal of the solid state NOR circuit;

a fourth transistor having fourth power terminals and a fourth gate terminal, one of the fourth power terminals being connected to the second input power terminal of the solid state NOR circuit, the other of the fourth power terminals being connected to the other of the first power terminals of the first transistor, the gate terminal of the fourth transistor being connected to the output terminal of the solid state NOR circuit; and fifth and sixth transistors, one of the fifth and sixth transistors being an enhancement mode field-effect transistor and the other of the fifth and sixth transistors being a depletion mode field-effect transistor, the fifth and sixth transistors having respective fifth and sixth pairs of power terminals and respective fifth and sixth gate terminals, one of each of the power terminals in the fifth and sixth pairs of power terminals being connected to the first input power terminal of the solid state NOR circuit, the other of each of the power terminals in the fifth and sixth pair of power terminals being connected to the output terminal of the solid state NOR circuit, and each of the gates of the fifth and sixth transistors being connected to the other first power terminal of the first transistor;

a seventh input transistor having seventh power terminals and a seventh gate terminal, the seventh gate terminal being connected to the second input terminal of the solid state NOR circuit, one of the seventh power terminals being connected to one of the first and second input power terminals of the solid state NOR circuit and the other of the seventh power terminals being connected to the third gate terminal of the third transistor; and an eighth input transistor having eighth power terminals and an eighth gate terminal, the eighth gate terminal being connected to the second input terminal of the solid state NOR circuit, one of the eighth power terminals being connected to the same one of the first and second input power terminals of the solid state NOR circuit to which the one of the seventh power terminals of the seventh input transistor is connected, and the other of the eighth power terminals being connected to the output terminal of the solid state NOR circuit, whereby the output logic signal is the logical NOR of the first input logic signal and the second input logic signal.

13. The solid state NOR circuit of claim 12 wherein the third electronic component is a third transistor, the third transistor having the third power terminals and a third gate terminal, the third gate terminal being connected to one of the third power terminals and to the other of the first power terminals, the other of the third power terminals being connected to the first input power terminal of the solid state NOR circuit.

14. The solid state NOR circuit of claim 12 wherein the first, second, fourth, fifth and sixth transistors and the third electronic component are gallium-arsenide technology devices.

15. The solid state NOR circuit of claim 12 wherein the first, second, and fourth transistors are enhancement mode field-effect transistors and the third electronic component is a depletion mode field-effect transistor.

16. A method for producing a solid state buffer circuit that generates an output signal in response to an input signal, the solid state buffer circuit having an input terminal to receive the first input signal, an output terminal to produce the output signal, and first and second input power terminals, the method comprising the steps of:

a) producing a first input transistor having first power terminals and a first gate terminal, the first gate terminal being connected to the input terminal of the solid state buffer circuit and one of the first power terminals being connected to the second input power terminal of the solid state buffer circuit;

b) producing a second input transistor having second power terminals and a second gate terminal;

c) connecting the second gate terminal to the input terminal of the solid state buffer circuit;

d) connecting one of the second power terminals to the second input power terminal of the solid state buffer circuit;

e) connecting the other of the second power terminals to the output terminal of the solid state buffer circuit;

f) producing a third transistor having third power terminals and a third gate terminal;

g) connecting the third gate terminal to one of the third power terminals and to the other of the first power terminals;

h) connecting the other of the third power terminals to the first input power terminal of the solid state buffer circuit;

i) producing a fourth transistor having fourth power terminals and a fourth gate terminal;

j) connecting one of the fourth power terminals to the second input power terminal of the solid state buffer circuit;

k) connecting the other of the fourth power terminals to the other of the first power terminals of the first transistor and to the third gate terminal;

l) connecting the gate of the fourth transistor to the output terminal of the solid state buffer circuit;

m) producing fifth and sixth transistors, one of the fifth and sixth transistors being an enhancement mode field-effect transistor and the other of the fifth and sixth transistors being a depletion mode field-effect transistor, the fifth and sixth transistors having respective fifth and sixth pairs of power terminals and respective fifth and sixth gate terminals;

n) connecting one of each of the power terminals in the fifth and sixth pairs of power terminals to the first input power terminal of the solid state buffer circuit;

o) connecting the other of each of the power terminals in the fifth and sixth pair of power terminals to the output terminal of the solid state buffer circuit, and p) connecting each of the gates of the fifth and sixth transistors to the gate of the third transistor.

17. The method of claim 16 wherein the first, second, and fourth transistors are enhancement mode field-effect transistors and the third transistor is a depletion mode field-effect transistor.

18. The method of claim 16, further comprising the steps of:

q) causing the first input power terminal of the solid state buffer circuit to supply a source voltage to the solid state buffer circuit;

r) causing the second input power terminal of the solid state buffer circuit to supply a drain voltage to the solid state buffer circuit;

s) wherein the one of the first power terminals is connected to the second input power terminal of the solid state buffer circuit, and the one of the second power terminals is connected to the second input power terminal of the solid state buffer circuit, the other of the third power terminals is connected to the first input power terminal of the solid state buffer circuit, the other of the fourth power terminals is connected to the second input power terminal of the solid state buffer circuit, and each of the power terminals in the fifth and sixth pairs of power terminals is connected to the first input power terminal of the solid state buffer circuit.

19. A solid state buffer circuit having input terminal means, an output terminal means, and first and second input power terminal means, comprising:

a first input transistor means having two first power terminal means and a first gate terminal means, the first gate terminal means being connected to the input terminal means of the solid state buffer circuit and one of the two first power terminal means being connected to one of the first and second input power terminal means of the solid state buffer circuit;

a second input transistor means having two second power terminal means and a second gate terminal means, the second gate terminal means being connected to the input terminal means of the solid state buffer circuit, one of the second power terminal means being connected to the same one of the first and second input power terminal means of the solid state buffer circuit to which the one of the first power terminal means of the first input transistor means is connected, and the other of the second power terminal means being connected to the output terminal means of the solid state buffer circuit;

a third transistor means having two third power terminal means and a third gate terminal means, the third gate terminal means being connected to one of the two third power terminal means and to the other of the first power terminal means, the other of the third power terminals means being connected to the other of the first and second input power terminal means of the solid state buffer circuit;

a fourth transistor means having two fourth power terminal means and a fourth gate terminal means, one of the fourth power terminal means being connected to the same one of the first and second input power terminal means of the solid state buffer circuit to which the one of the first power terminal means of the first input transistor means is connected, the other of the fourth power terminal means being connected to the other of the first power terminal means of the first transistor means and to the third gate terminal means and the one of the third power terminal means, the gate means of the fourth transistor means being connected to the output terminal means of the solid state buffer circuit; and fifth and sixth transistor means, one of the fifth and sixth transistor means being an enhancement mode field-effect transistor and the other of the fifth and sixth transistor means being a depletion mode field-effect transistor, the fifth and sixth transistor means having respective fifth and sixth pairs of power terminal means and respective fifth and sixth gate terminal means, one of each of the power terminals means in the fifth and sixth pairs of power terminal means being connected to the other of the first and second input power terminal means of the solid state buffer circuit, the other of each of the power terminal means in the fifth and sixth pair of power terminal means being connected to the output terminal means of the solid state buffer circuit, and each of the gate means of the fifth and sixth transistor means being connected to the other first power terminal means of the first transistor means.

20. The solid state buffer circuit of claim 19 wherein the first, second, and fourth transistor means are enhancement mode field-effect transistors and the third transistor means is a depletion mode field-effect transistor.

21. The solid state buffer circuit of claim 19 wherein the first, second, fourth, fifth and sixth transistors and the third transistor means are gallium-arsenide technology devices.

22. A solid state buffer circuit having first and second input terminals, an output terminal, and first and second input power terminals, comprising:

a first input transistor means having two first power terminal means and a first gate terminal means, the first gate terminal means being connected to the first input terminal of the solid state buffer circuit and one of the two first power terminal means being connected to one of the first and second input power terminals of the solid state buffer circuit;

a second input transistor means having two second power terminal means and a second gate terminal means, the second gate terminal means being connected to the first input terminal of the solid state buffer circuit, one of the second power terminal means being connected to the same one of the first and second input power terminals of the solid state buffer circuit to which the one of the first power terminal means of the first input transistor means is connected, and the other of the second power terminal means being connected to the output terminal of the solid state buffer circuit;

a third transistor means having two third power terminal means and a third gate terminal means, the third gate terminal means being connected to one of the two third power terminal means and to the other of the first power terminal means, the other of the third power terminals means being connected to the other of the first and second input power terminals of the solid state buffer circuit;

a fourth transistor means having two fourth power terminal means and a fourth gate terminal means, one of the fourth power terminal means being connected to the same one of the first and second input power terminals of the solid state buffer circuit to which the one of the first power terminal means of the first input transistor means is connected, the other of the fourth power terminal means being connected to the other of the first power terminal means of the first transistor means and to the third gate terminal means and the one of the third power terminal means, the gate means of the fourth transistor means being connected to the output terminal of the solid state buffer circuit;

fifth and sixth transistor means, one of the fifth and sixth transistor means being an enhancement mode field-effect transistor and the other of the fifth and sixth transistors being a depletion mode field-effect transistor, the fifth and sixth transistor means having respective fifth and sixth pairs of power terminal means and respective fifth and sixth gate terminal means, one of each of the power terminals means in the fifth and sixth pairs of power terminal means being connected to the other of the first and second input power terminals of the solid state buffer circuit, the other of each of the power terminal means in the fifth and sixth pair of power terminal means being connected to the output terminal of the solid state buffer circuit, and each of the gate means of the fifth and sixth transistor means being connected to the other first power terminal means of the first transistor means; and seventh and eighth transistor means having respective seventh and eighth pairs of power terminal means and respective seventh and eighth gate terminal means, one of each of the power terminal means in the seventh and eighth pairs of power terminal means being connected to the one of the first and second input power terminals of the solid state buffer circuit, the other of the power terminal means in the seventh pair of power terminal means being connected to the other of the first and second input power terminal means of the first input transistor means, and the other of the eighth pair of power terminal means being connected to the output terminal of the solid state buffer circuit, and each of the gate means of the seventh and eighth transistor means being connected to the second input terminal of the solid state buffer circuit.

23. The solid state buffer circuit of claim 22 wherein the first, second, fourth, seventh and eighth transistor means are enhancement mode field-effect transistors and the third transistor means is a depletion mode field-effect transistor.

24. The solid state buffer circuit of claim 22 wherein the first, second, third, fourth, fifth, sixth, seventh and eighth transistor means are gallium-arsenide technology devices.

* * * * *